United States Patent [19]
Isono

[11] Patent Number: 5,726,590
[45] Date of Patent: Mar. 10, 1998

[54] INTERFACE IN A SEMICONDUCTOR INTEGRATED CIRCUIT

[75] Inventor: Toshio Isono, Tokyo, Japan

[73] Assignee: NEC Corporation, Tokyo, Japan

[21] Appl. No.: 660,174

[22] Filed: Jun. 3, 1996

[30] Foreign Application Priority Data

Jun. 2, 1995 [JP] Japan .................. 7-136247

[51] Int. Cl.$^6$ .................. H03K 17/16
[52] U.S. Cl. .................. 326/86; 326/34; 326/81
[58] Field of Search .................. 326/21, 33, 34, 326/63, 80–81, 82–83, 86, 121

[56] References Cited

U.S. PATENT DOCUMENTS

| | | | |
|---|---|---|---|
| 5,144,165 | 9/1992 | Dhong et al. | 326/80 |
| 5,151,619 | 9/1992 | Austin et al. | 326/86 |
| 5,442,307 | 8/1995 | Shigehara et al. | 326/81 |
| 5,539,335 | 7/1996 | Kobayashi et al. | 326/121 X |
| 5,574,389 | 11/1996 | Chu | 326/81 |
| 5,635,861 | 6/1997 | Chan et al. | 326/27 X |
| 5,646,550 | 7/1997 | Campbell, Jr. et al. | 326/81 |

FOREIGN PATENT DOCUMENTS 53-105357  9/1978  Japan .

*Primary Examiner*—David R. Hudspeth
*Attorney, Agent, or Firm*—Sughrue, Mion, Zinn, Macpeak & Seas, PLLC

[57] ABSTRACT

A three-state buffer operating at a 3V power source supplies a three-state signal to a bus line pulled up to a 5V power source line. The three-state buffer includes CMOS transistors each receiving an output signal from a pre-stage buffer arid a transfer gate connected between the output of the CMOS transistors and the output terminal of the integrated circuit. The back-gate of the p-channel transistor of the CMOS is maintained at an intermediate potential between the 3V source line and the ground line while being in a floating state. The intermediate potential is presented by a serial three transistors. A low power dissipation and a high speed operation can be obtained by the circuit.

9 Claims, 4 Drawing Sheets

3VLSI

INTERFACE IN A SEMICONDUCTOR INTEGRATED CIRCUIT

BACKGROUND OF THE INVENTION (a) Field of the Invention

The present invention relates to an interface in a semiconductor integrated circuit and, in particular, to a circuit configuration of an interface of a CMOS semiconductor integrated circuit.

(b) Description of the Related Art

Advance in the semiconductor manufacturing technology has lead to a submicron order miniaturization of CMOS transistors in which gate lengths are reduced down to 0.6 μm or less and the thickness of gate oxide films down to 120 angstroms or less. In this sphere, the source voltage is reduced from 5V to 3V based on the demands of device characteristics and reliability.

On the other hand, a number of LSIs which operate with the source voltage at 5V as with the conventional devices are available on the market. Accordingly, it is indispensable that the submicron LSIs be provided with the function to deliver a 5V signal or the function to be connectible with a 5V bus line, while operating by itself with a source voltage at 3V.

FIG. 1 illustrates a conventional integrated circuit (3V LSI) operating with a source voltage at 3V and having an output connected to a 5V bus line. The 3V LSI includes an output section including a final stage CMOS transistors implemented by a p-channel transistor 1 and an n-channel transistor 2 and a transfer gate implemented by an n-channel MOS transistor 3, an output terminal 4 of the LSI, a pre-stage buffer section 5 which drives the final stage CMOS transistors 1 and 2.

The output terminal 4 is connected to the 5V bus line 12 pulled up by a pull-up resistor 6 connecting the bus line 12 with a 5V source line (Vp line). The output section 5 functions as a three-state buffer assuming three states including an H-level, an L-level and a high impedance state, in accordance with a high level on both output lines 14 and 15, a low level on both the output lines, and a high level on the output line 14 and a low level on the output line 15, respectively.

The MOS transistors 1, 2 and 3 are implemented by submicron order MOS transistors having a gate length of 0.6 μm or less and a thickness of the gate oxide film at 120 angstroms or less. That is, a high source voltage of 5V cannot be applied between the gate electrode and the source or drain electrode of the MOS transistors. The circuit scheme of FIG. 1 is thus employed for the interface between the 3V LSI and a 5V bus line.

As shown in FIG. 1, the gate of the n-channel transistor 3 is connected to 3V $V_{DD}$ line, and the source-drain path thereof is connected between an output node 13 of the final stage CMOS transistors 1 and 2 and the output terminal 4. In operation, after the output terminal 4 is pulled up to the 5V source voltage as a result of a signal change, the voltage between the gate and the drain of the p-channel transistor 3 is 2V, which remains within the nominal working voltage (3V) of the p-channel transistor 3. In addition, if the p-channel transistor 3 is designed to have a threshold voltage of 0V, no overvoltage will be generated between the gate electrode and source electrode because the potential of the output node 13 cannot also rise above 3V. In this manner, the CMOS transistors 1 and 2 are free from the overvoltage while supplying an output signal to the 5V bus line 12.

The n-channel transistor 3 is designed to have the threshold voltage of 0V for the reason that in the event that the output terminal 4 is made open, it is necessary that the amplitude of an output signal on the output node 13 from the final stage CMOS transistors 1 and 2 be directly transmitted to the output terminal 4. The transistors 1 and 2 have a threshold voltage which is on the order of 0.6V, as is the case of usual CMOS LSI. However, if the transistor 3 has a threshold voltage of 0.6V, when the output node 13 has a level of 3V, the potential at the output terminal 4 will be 3V−0.6V=2.4V. That is, a full excursion of the output signal is not obtained. Accordingly, a sophistication is generally made to lower the threshold voltage by forming the n-channel transistor 3 in the region of the substrate where the impurity concentration is lower as compared to the other region.

However, in the circuit configuration of FIG. 1, a leakage current flows from the 5V source line to the 3V LSI, resulting in a disadvantage of a high power dissipation. More specifically, the threshold voltage of the n-channel transistor 3 may vary from 0V to −0.3V, for example, as a result of a temperature change or a variation from product to product. In this case, when the potential of the output terminal 4 reaches 5V, the potential of the output node 13 will be 3V−(−0.3V)=3.3V. Accordingly, a parasitic diode 7 formed of the drain (P+) and back-gate (N+) of the p-channel transistor 1 is forward-biased, causing a leakage current to flow from the 5V source line Vp to the 3V source line $V_{DD}$.

To accommodate for the situation as described above, a remedy may be employed which causes the gate voltage of the n-channel transistor 3 to be reduced below 3V to thereby suppress the leakage current. However, such means disadvantageously raises a problem of a reduction in the driving capability of the n-channel transistor 3 which substantially governs the driving capability of the output section of the 3V LSI.

SUMMARY OF THE INVENTION

It is an object of the present invention to provide a semiconductor integrated circuit having an output section which functions as an interface between different source voltages substantially without degrading the driving capability thereof and with a lower leakage current, thereby operating at a high speed with a low power dissipation.

In accordance with the present invention, there is provided a semiconductor integrated circuit comprising: a first p-channel transistor having a drain, a back-gate and a source connected to a first source line fixed at a first potential; a first n-channel transistor having a source connected to a second source line fixed at a second potential, a drain connected to the drain of the first p-channel transistor at a first node, and a back-gate connected to the second source line; a second n-channel transistor having a gate connected to the first source line, and a source-drain path connected between the first node and a first terminal of the integrated circuit; and a circuit section having a first signal line connected to the back-gate of the first p-channel transistor, the first signal line being maintained at a third potential, which remains within the vicinity of the first potential, while being in a floating state.

In a semiconductor integrated circuit according to the present invention, the back-gate of the first p-channel MOS transistor is fixed to the third potential in the vicinity of the first potential while being in a floating state, thereby substantially eliminating a current caused by a foward-bias voltage applied to a parasitic diode formed in the first p-channel MOS transistor because of the floating state thereof. In this manner, a reduction in the driving capability in the output section implemented by the first p-channel transistor and first and second n-channel transistors is substantially avoided while maintaining a lower power dissipation.

DESCRIPTION OF THE PREFERRED EMBODIMENTS

Figure 1:
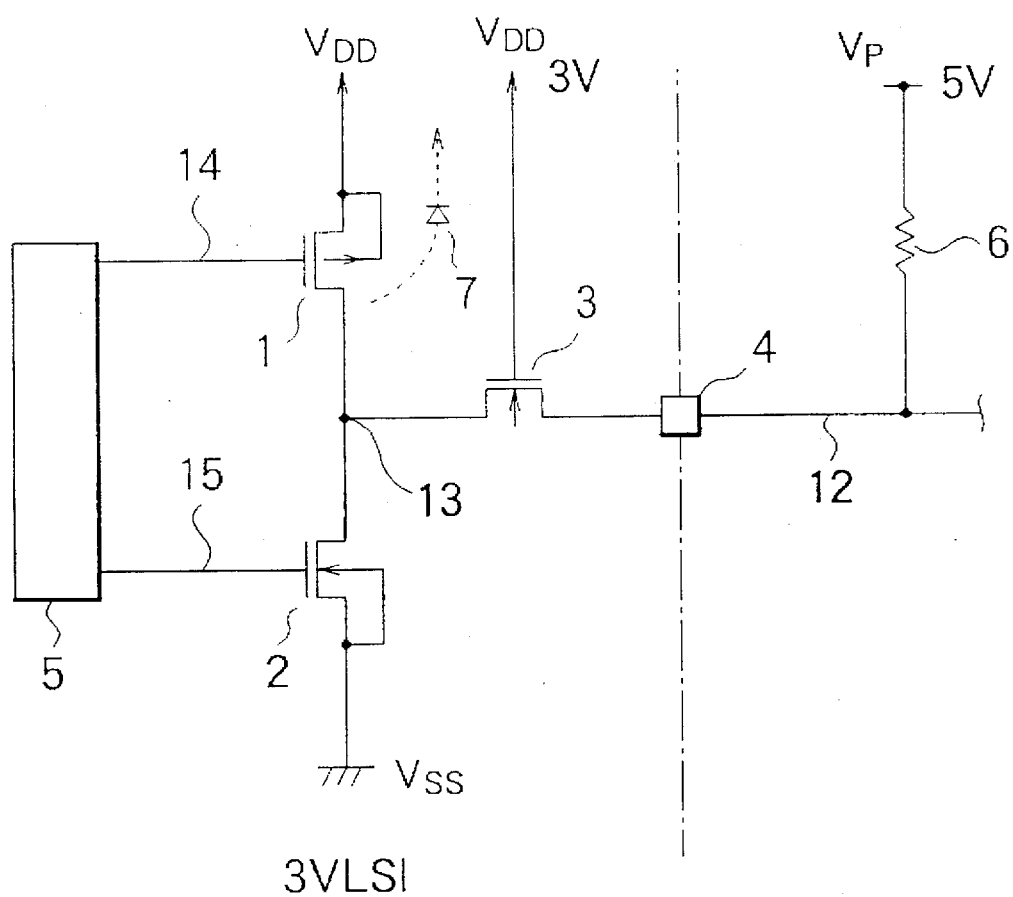
FIG. 1 is a circuit diagram of a conventional semiconductor integrated circuit including an output section which functions as an interface between a 3V circuit and a 5V bus line.

Referring to the accompanying drawings, the present invention will be specifically described below by way of embodiments thereof. It is to be noted that similar elements are designated by similar reference numerals throughout the drawings.

Embodiment 1

Figure 2:
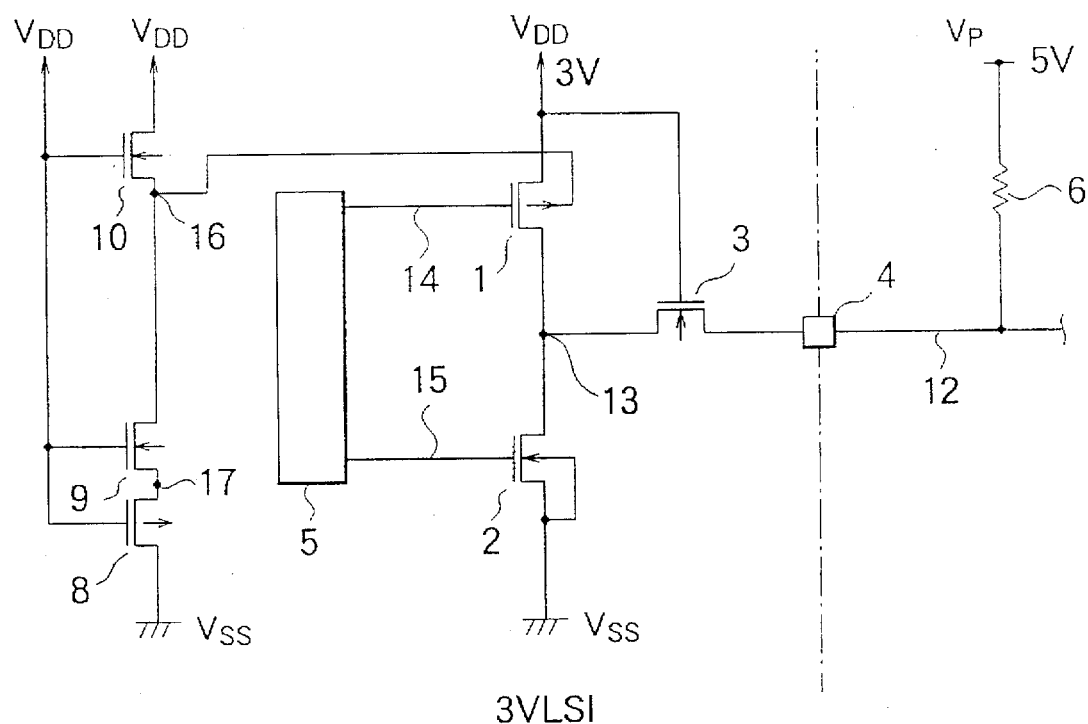
FIG. 2 is a circuit diagram of a semiconductor integrated circuit according to a first embodiment of the present invention.

FIG. 2 shows a semiconductor integrated circuit according to a first embodiment of the present invention. The integrated circuit according to the embodiment operates as a 3V LSI and includes a final stage CMOS transistors implemented by a first p-channel MOS transistor 1 and a first n-channel MOS transistors 2 connected at a first node 13 in series between a 3V source line ($V_{DD}$) and a ground line ($V_{SS}$), with the source of the first n-channel MOS transistor 2 being connected to the ground line $V_{SS}$, and a transfer gate implemented by a second n-channel MOS transistor 3 connected between the first node 13 and an output terminal 4 of the integrated circuit.

The 3V LSI includes a pre-stage buffer section 5 which drives the final stage CMOS transistors 1 and 2. The gates of the first p-channel MOS transistor 1 and the first n-channel MOS transistor 2 are connected to the output lines 14 and 15, respectively, of the pre-stage buffer section 5. The output terminal 4 is connected to a bus line 12 pulled up by a pull-up resistor 6 to a 5V source line (Vp). The final stage CMOS transistors 1 and 2 and the transfer gate 3 form an output section of the 3V LSI acting as a 3V–5V interface.

The 3V LSI further includes a circuit section including second p-channel MOS transistor 8, a third and a forth n-channel MOS transistors 9 and 10 all connected in series in this order, between the source line $V_{DD}$ and the ground line $V_{SS}$, with the drain of the second p-channel MOS transistor 8 being connected to the ground line $V_{SS}$ and the drain of the fourth n-channel MOS transistor 10 being connected to the source line $V_{DD}$. The gates of the second p-channel MOS transistor 8 and the third and fourth n-channel MOS transistors 9 and 10 are connected together to the source line $V_{DD}$. The back-gates of the first p-channel MOS transistor 1 and the first n-channel MOS transistor 2 are connected to a second node 16 connecting the source of the third n-channel MOS transistor 9 and the drain of the fourth n-channel MOS transistor 10 and the ground line $V_{SS}$, respectively.

In the circuit configuration, the back-gate of the first p-channel MOS transistor 1 is fixed to an intermediate potential, e.g., at 2.4V by the second node 16 while being in a floating state because of the OFF states of the fourth N-channel transistor 10 and the second p-channel transistor 8 (i.e., while preventing a leakage current from flowing from node 16). Specifically, assuming that the fourth n-channel MOS transistor 10 has a threshold voltage of 0.6V, the second node 16 assumes 2.4V which is obtained by subtracting the threshold voltage (0.6V) from the gate potential (3V) of the fourth n-channel MOS transistor 10. During the time interval when the second node 16 remains at 2.4V, the fourth n-channel transistor is in an OFF state. During this time interval, the second p-channel MOS transistor 8 is also OFF because of the gate voltage thereof at 3V, and accordingly, a third node 17 connecting the drains of the third n-channel MOS transistor 9 and second p-channel MOS transistor 8 also assumes 2.4V.

Figure 3A:
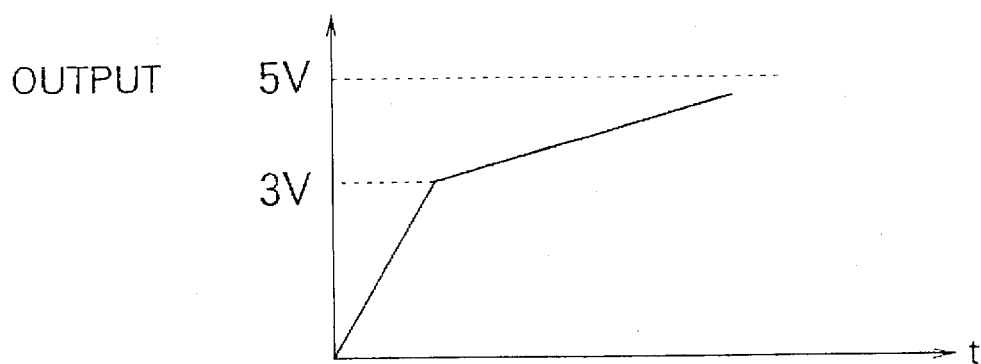
FIGS. 3A and 3B graphically illustrate waveforms appearing at the output terminal of the circuit of FIG. 2.
Figure 3B:
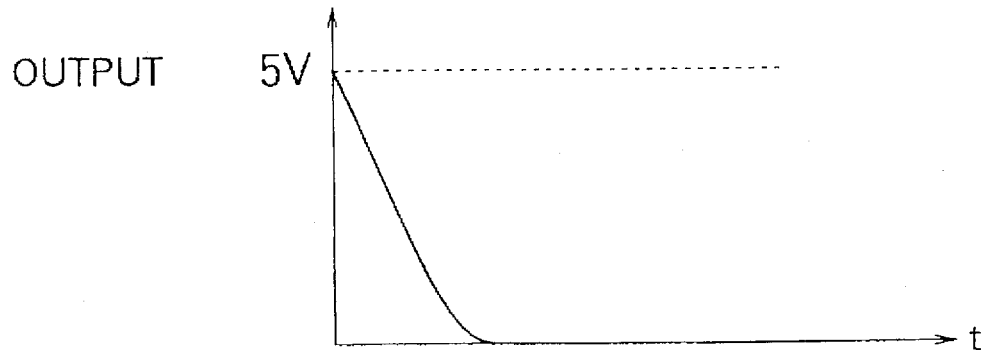

In operation, the final stage CMOS transistors 1 and 2 and the second n-channel transistor 3 function as a three-state buffer for delivering three states at the first node 13, the three state including a high level, a low level and a high impedance state in response to a signal from the pre-stage buffer section 5 through the pair of output lines 14 and 15. The potential of the output terminal 4 is illustrated in FIGS. 3A and 3B.

When both the signals on the output lines 14 and 15 of the pre-stage buffer section 5 change from a high level to a low level, the first n-channel MOS transistor 2 is turned OFF while the first p-channel MOS transistor 1 is turned ON, thereby passing a charging current to the output terminal 4. Since the transfer gate or second n-channel MOS transistor 3 has a threshold voltage of 0V, both the potentials of the first node 13 and the output terminal 4 rise up to 3V while maintaining a substantially equal potential therebetween. After the potential at the output terminal 4 reaches 3V, the second n-channel MOS transistor 3 is turned OFF, whereupon the charging current to the output terminal 4 stops. Subsequently, the potential at the output terminal 4 rises up to 5V to assume a high level in accordance with a time constant determined by the pull-up resistor 6 and the load capacitance of the 5V bus line, as depicted in FIG. 3A. In this case, the first node 13 cannot rise above 3V.

When both the signals on the output lines 14 and 15 of the pre-stage buffer section 5 change from a low level to a high level, the first p-channel MOS transistor 1 is turned OFF while the first n-channel MOS transistors 2 and then the second n-channel MOS transistor 3 are turned ON. Accordingly, a discharge current flows from the output terminal 4 to the ground line $V_{SS}$, whereby the potential of the output terminal 4 falls from 5V to 0V, as graphically illustrated in FIG. 3B.

When the output line 14 and the output line 15 of the pre-stage buffer section 5 assume a high level and a low level, respectively, both the transistors 1 and 2 are turned OFF. There is no path for the current to flow into or out of the bus line 12, whereby the bus line 12 assumes a floating state.

When a high level is delivered to the gate of the first p-channel transistor 1 from the pre-stage buffer section 5, the back-gate (second node 16) of the p-channel MOS transistor 1 is fixed at 2.4V by the function of the transistors 8 to 10 while remaining in a floating state, as described above. Accordingly, the current caused by the foward-bias for the parasitic diode does not flow from the 5V source line through the back-gate of the first p-channel transistor 1. Hence, there is substantially no leakage current flowing based on a temperature change or variation of the threshold voltage.

Although the driving capability of the first p-channel transistor 1 is reduced due to the back-bias effect, the influence of the reduction in the driving capability of the p-channel transistor 1 upon the circuit operation is insignificant in the output section since the charging current for the output terminal 4 is predominantly governed by the second n-channel MOS transistor 3, which has a smaller current drivability as compared to the CMOS transistors.

Embodiment 2

Figure 4:
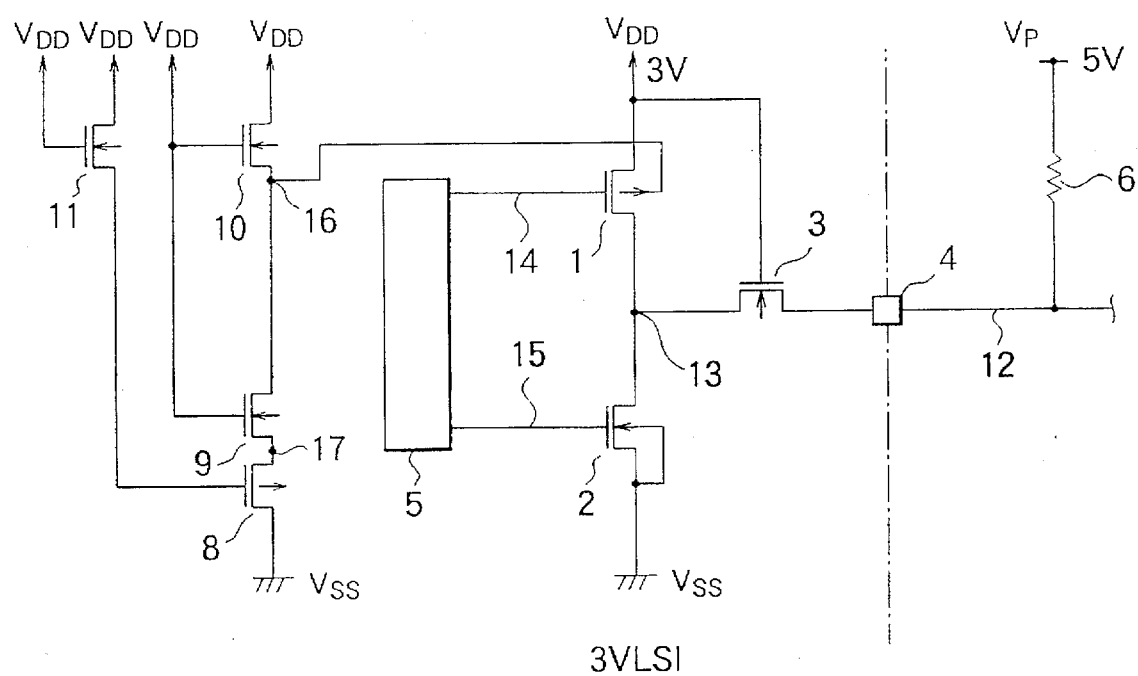
FIG. 4 is a circuit diagram of a semiconductor integrated circuit according to a second embodiment of the present invention.

FIG. 4 shows a semiconductor integrated circuit according to a second embodiment of the present invention. The embodiment of FIG. 3 includes a fifth n-channel MOS transistor 11 additionally to the circuit configuration of the first embodiment shown in FIG. 2. The source-drain path of the fifth n-channel MOS transistor 11 is connected between the source line $V_{DD}$ and the gate of the second p-channel MOS transistor 8, with the gate of the fifth n-channel MOS transistor 11 being connected to the source line $V_{DD}$.

In the present embodiment, the back-gate of the first p-channel MOS transistor 1 connected to the second node 16 is fixed to an intermediate potential at 2.4V by using the transistors 8, 9 and 10 in a manner similar to that described with reference to FIG. 2. The present embodiment differs from the first embodiment in that the gate voltage of the second p-channel MOS transistor 8 is fixed to a lower potential which is below the second source voltage $V_{DD}$ (3V) by an amount corresponding to the threshold voltage (0.6V) of the fifth n-channel MOS transistor 11. The circuit functions additionally to the function of the first embodiment, as mentioned below.

When the second node 16 assumes a potential which is equal to $V_{DD}$–0.6V, the second node 16 remains in a floating state for suppression of the leakage current. If the potential at the first node 13 changes, such a change causes a corresponding change in the potential of the second node 13 through a capacitive coupling between the drain and the back-gate of the first p-channel MOS transistor 1. If the potential at the second node 16 falls below $V_{DD}$–0.6V as a result of such a potential change caused by the capacitive coupling, the fourth n-channel MOS transistor 10 is turned ON, thereby raising the potential of the second node 16 up to $V_{OC}$–0.61V.

On the other hand, if the potential at the second node 16 rises above $V_{DD}$ as a result of the potential change caused by the capacitive coupling, the potential at the third node 17 also rises above $V_{DD}$. However, since the gate voltage of the second p-channel MOS transistor 8 is maintained at $V_{DD}$–0.6V by the function of the fifth n-channel MOS transistor 11, the gate-source voltage of the transistor 8 becomes equal to 0.6V, which turns the transistor 8 ON to lower the potentials of the second and third nodes 16 and 17. Accordingly, the second node 16 does not also rise above $V_{DD}$.

In the first embodiment, the gate voltage of the second p-channel MOS transistor 8 is fixed at $V_{DD}$, and hence the second p-channel transistor 8 is not turned ON unless the voltage at the second node 16 rises equal to or above $V_{DD}$+0.6V. That is, the second node 16 rises up to $V_{DD}$+0.6V in the first embodiment while the second node 16 remains not higher than $V_{DD}$ in the second embodiment. Accordingly, excursion of the voltage change in the second node is lowered in the second embodiment as compared to that in the first embodiment, thereby achieving a more stable operation of the output section.

As described above, the integrated circuits of the embodiments which operate at the low voltage of 3V and supply an output to a 5V bus line have a suitable function substantially without degrading the driving capability thereof and without a leakage current. In short, a 3V–5V interface which operates at a high speed with a reduced power dissipation can be realized in the integrated circuits.

Since above embodiments are described only for examples, the present invention is not limited to such embodiments and it will be obvious for those skilled in the art that various modifications or alterations can be easily made based on the above embodiments within the scope of the present invention.

What is claimed is:

1. A semiconductor integrated circuit comprising: a first p-channel transistor having a drain, a back-gate and a source connected to a first source line fixed at a first potential; a first n-channel transistor having a source connected to a second source line fixed at a second potential, a drain connected to said drain of said first p-channel transistor at a first node, and a back-gate connected to said second source line; a second n-channel transistor having a gate connected to said first source line, and a source-drain path connected between said first node and a first terminal of said integrated circuit; and a circuit section having a first signal line connected to said back-gate of said first p-channel transistor, said first signal line being maintained at a third potential while preventing a leakage current from flowing from said first node, said third potential being in the vicinity of said first potential.

2. The semiconductor integrated circuit as defined in claim 1 further comprising a buffer section having a first output line connected to said gate of said first p-channel transistor and a second output line connected to said gate of said first n-channel transistor.

3. The semiconductor integrated circuit as defined in claim 1 wherein said circuit section includes a second p-channel transistor, a third n-channel transistor and a fourth n-channel transistor all connected in series between said first source line and second source line, wherein a second node connecting said third n-channel transistor and fourth n-channel transistor implements said first signal line.

4. The semiconductor integrated circuit as defined in claim 3 wherein gates of said second p-channel transistor and said third and fourth n-channel transistors are connected together to said first source line.

5. The semiconductor integrated circuit as defined in claim 4 wherein said third potential is between said first potential minus a threshold voltage of said fourth n-channel transistor and said first potential plus said threshold.

6. The semiconductor integrated circuit as defined in claim 3 wherein said circuit section further includes a fifth n-channel transistor having a gate connected to said first source line, a source connected to said first source line and a drain connected to a gate of said second p-channel transistor, and gates of said third and fourth n-channel transistors are connected to said first source line.

7. The semiconductor integrated circuit as defined in claim 6 wherein said third potential is between said first potential minus a threshold voltage of said fourth n-channel transistor and said first potential.

8. The semiconductor integrated circuit as defined in claim 1 wherein said first terminal is connected to a bus line, wherein said first p-channel transistor and said first and second n-channel transistor function as a three-state buffer.

9. The semiconductor integrated circuit as defined in claim 8 wherein said bus line is connected to a third source line fixed at a third potential through a pull-up resistor, said third potential being higher than said first potential, said first potential being higher than said second potential.

* * * * *